US006327034B1

(12) United States Patent
Hoover et al.

(10) Patent No.: US 6,327,034 B1
(45) Date of Patent: Dec. 4, 2001

(54) APPARATUS FOR ALIGNING TWO OBJECTS

(76) Inventors: Rex Hoover; Robert G. Hoover, both of 5263 Stewart Rd., Sumerduck, VA (US) 22742

( * ) Notice: Subject to any disclaimer, the term of this patent is extended or adjusted under 35 U.S.C. 154(b) by 0 days.

(21) Appl. No.: 09/399,087

(22) Filed: Sep. 20, 1999

(51) Int. Cl.$^7$ .............................. G01B 11/00; G03B 21/18
(52) U.S. Cl. ............................ 356/400; 356/401; 355/53
(58) Field of Search ................................... 356/399–401; 250/548; 355/53, 55

(56) References Cited

U.S. PATENT DOCUMENTS 5,324,012 * 6/1994 Aoyama et al. ....................... 269/21
5,724,121 * 3/1998 McKinley et al. ...................... 355/53

* cited by examiner

Primary Examiner—F. L. Evans
Assistant Examiner—Zandra Smith
(74) Attorney, Agent, or Firm—C. C. Shroff; Papan Devnani, Esq.

(57) ABSTRACT

A system for aligning a mask and a product with high precision, featuring a means for supporting a product in a fixed position and a mask adjacent to the product so that the mask is movable relative to the product. The mask is surrounded by a rectangular mask frame. At least one movable first plunger presses against a first edge of the mask frame, while two movable second plungers press against a second edge of the mask frame, where the first and second edges are perpendicular. A first computer-controlled movable push plate is designed to push the mask frame against said at least one movable first plunger; pushing the mask frame in a first direction. Two second movable computer-controlled plates are designed to move the mask frame in a second direction by pushing the mask frame against the two movable second plungers. The two second movable computer-controlled push plates may also be used to rotate the mask frame by moving one of the second movable push plates toward one of the movable second plungers, while controlled simultaneously moving the other of the second movable push plates away from the other of the movable second plungers. A computer is used to determine the relative position of the mask and the product prior to alignment; and that, to achieve proper alignment of the mask and the product, the mask must be moved in the first direction by a first distance, moved in the second direction by a second distance, and rotated by a defined amount. The computer then signals the first computer controlled movable push plate to push the mask frame in the first direction by the first distance; and also signals the two second computer-controlled movable push plates to push the mask frame in the second direction by said second distance. If rotation of the mask is required, the two second computer-controlled movable push plates are signaled to rotate the mask frame by said defined amount.

15 Claims, 8 Drawing Sheets

APPARATUS FOR ALIGNING TWO OBJECTS

FIELD OF THE INVENTION

The field of the invention relates to an improved apparatus for automatically and precisely aligning two superimposed objects (i.e., aligning a semiconductor wafer or other substrate coated with photoresist material with a mask), and to a method of aligning objects using the apparatus.

BACKGROUND ART

In the present day manufacture of integrated circuits, complex circuit patterns are formed on a silicon wafer by photoresist techniques employing a series of contact printings on the wafer. These contacts printings are made from several transparent masks used in succession and in a preselected order. Each successive mask must be accurately aligned with the previous print or prints made on the wafer from the prior masks so that the completed pattern is accurate within a few microns.

The alignment of each mask with the wafer may be accomplished manually by manipulation of the mask over the wafer while the operator observes the mask and wafer through a high power microscope. Alignment may be aided by the use of a pair of spaced-apart detection marks or alignment patterns, for example, crosses, bull's-eyes, or pinpoint alignment holes, formed on each of the wafer and mask, the pair of alignment patterns on the mask being arranged so that they are superimposed over and aligned with the pair of alignment patterns on the wafer when the wafer and mask are properly aligned Apparatus has been proposed for producing alignment of the mask and wafer automatically, thus relieving the operator of this tedious task One form of such automatic apparatus is described in U.S. Pat. No. 3,497,705 issued Feb. 24, 1970, to A. J. Adler and entitled "Mask Alignment System Using Radial Patterns And Flying Spot Scanning". In that system a pair of spaced-apart radial alignment patterns on the wafer is adapted for alignment with a superimposed pair of spaced-apart radial alignment patterns on the transparent mask. The radials of the alignment patterns on the mask are uniformly angularly displaced relative to the radials of the alignment patterns on the wafer when the mask and wafer are properly aligned. A scanning system employing two flying spot scanners scans each of the two pairs of alignment patterns in a circular manner about a center point, measuring the angular distance between the successive radials encountered by the scanning beam. Error signals derived from misalignment of the radials of the alignment patterns on the mask relative to the radials of the alignment patterns on the wafer are utilized to produce relative movement in X, Y, and rotational directions to bring the two pairs of alignment into proper alignment.

Karlson et al., in U.S. Pat. No. 4,052,603, published Oct. 4, 1977, discloses a system for aligning a pattern mask and a photoresist-coated substrate which are separated by an optical element which involves a system for correcting misalignment in the x- or y-directions between the mask and the substrate by using stepper motors to move the substrate in the x-direction or in the y-direction relative to the mask. Rotational misalignment is corrected using a separate mechanism involving gears and levers to rotate the mask relative to the substrate. This apparatus involves use of two separate systems simultaneously to achieve successful alignment, and is rather complicated It would be desirable to have a system which moves the mask relative to a fixed substrate, rather than moving both the mask and the substrate relative to each other. It would also be desirable to achieve rotational motion and motion in the x-direction or in the y-direction relative to the substrate with a single mechanism, rather than with two separate mechanisms.

SUMMARY OF THE INVENTION

The objects of the invention are to provide an improved apparatus for bringing two products into alignment with high precision, and to provide a method for using the apparatus to successfully align two objects.

The invention provides a system for aligning a product, such as a semiconductor wafer or other substrate coated with a photoresist material, and a mask with high precision. The mask has a plurality of first detection marks, and the product has a plurality of second detection marks. When the mask and the product are properly aligned, each first detection mark is precisely aligned with a second detection mark. The system features a product securing surface, where the product securing surface is made from a porous plate adapted to support the product, a means for securing the product to the porous plate by applying vacuum to the product through the porous plate, and at least two registration pins adapted to fit through registration holes in the product. The invention also features a surface for positioning a mask. Normally, the mask is surrounded by a rectangular mask frame having at least two holes therethrough. The mask frame is then positioned on the mask positioning surface. The mask positioning surface features a holding plate adapted to support the mask frame and at least two alignment pins adapted to fit through alignment holes in the mask frame. Preferably, the porous plate is a recessed portion of the holding plate supporting the mask frame.

When the mask frame is positioned on the mask positioning surface, a movable first plunger presses against a first edge of the mask frame, and two movable second plungers press against a second edge of the mask frame, where the second edge of the mask frame is perpendicular to the first edge. The plungers provide resistance to accidental movement of the mask frame. Purposeful movement of the mask frame is generated by a series of computer-controlled push plates. A first computer-controlled movable push plate is designed to move the mask frame in a first direction by pushing the mask frame against the movable first plunger, while two second movable computer-controlled push plates are designed to move the mask frame in a second direction by pushing the mask frame against said two movable second plungers. The two second movable computer-controlled push plates can also cause rotation of the mask frame by moving one of the second movable push plates toward one of the movable second plungers, while either holding the other of the second movable push plates in a stationary position; or by simultaneously moving one of the second movable push plates toward one of the movable second plungers moving the other of the second movable push plates away from the other of the movable second plungers.

The system additionally features an imaging means comprising a video camera and an optical microscope adapted to focus an image of the mask and/or the product onto the imaging plane of the video camera. The video camera records an image of each second detection mark on said product and an image of each first detection mark on said mask, and transmits each image recorded on the imaging plane to a computer.

The computer records the position of each second detection mark on the product; and also records the position of each first detection mark on said mask. The computer then compares the positions of the first detection marks to the positions of the second detection marks, and determines that to bring each first detection mark into alignment with a second detection mark, the mask must be moved in the first direction by a first distance, moved in the second direction by a second distance, and rotated by a defined amount. Then computer then:

a) signals the stepper motor controlling the first computer-controlled movable push plate to move the mask frame toward the movable first plunger (hereinafter defined as the x-direction) by the computer-determined first distance;

b) signals the stepper motors controlling the two second computer-controlled movable push plates to move the mask frame toward the movable second plungers plunger (hereinafter defined as the y-direction) by the computer-determined second distance; and c) signals the stepper motors controlling the two second computer-controlled movable push plates to rotate the mask frame by the defined amount.

DETAILED DESCRIPTION OF THE PREFERRED EMBODIMENT

A) Mask Alignment Tool

Figure 1:
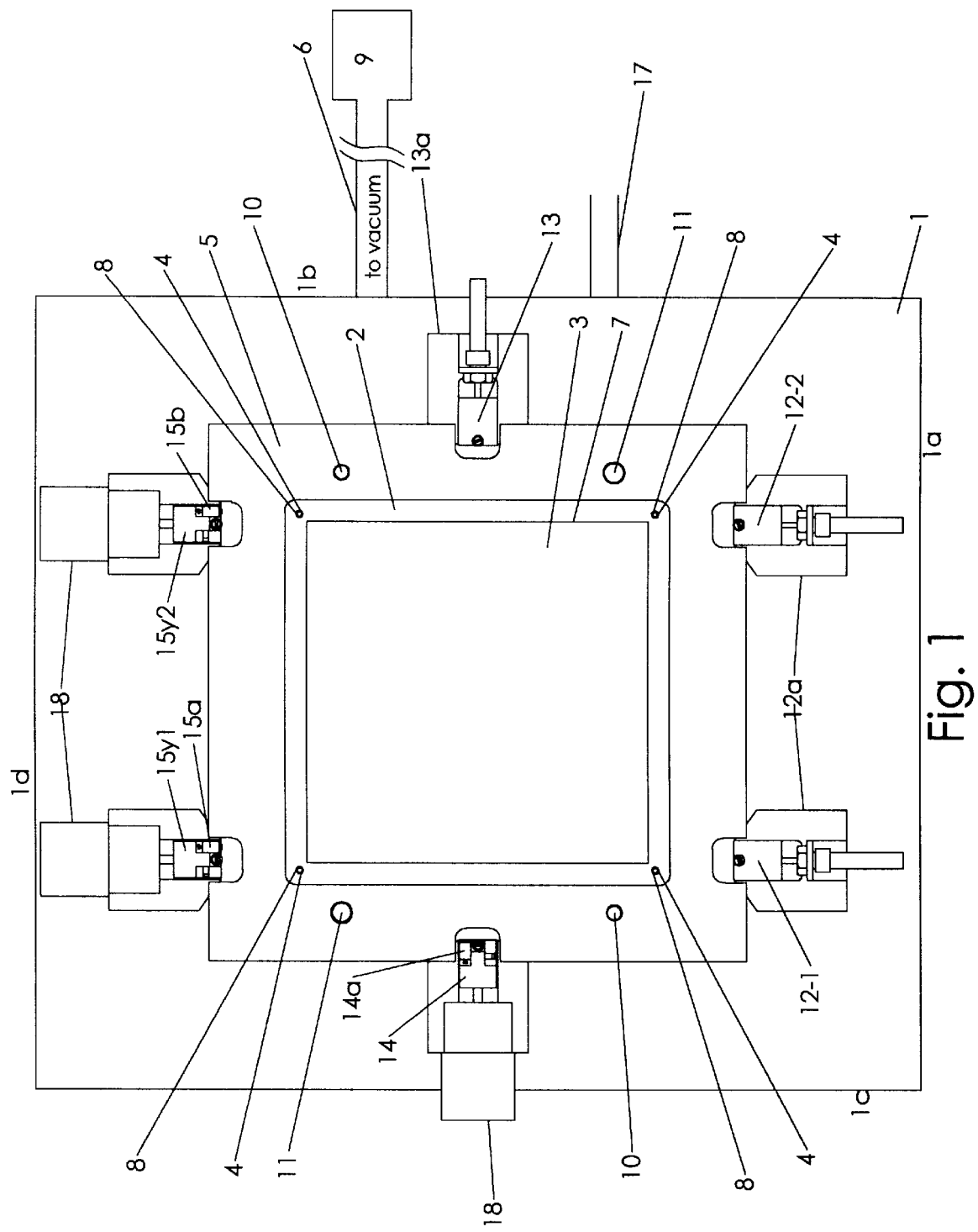
FIG. 1 shows an alignment tool for use in the inventive system.
Figure 2:
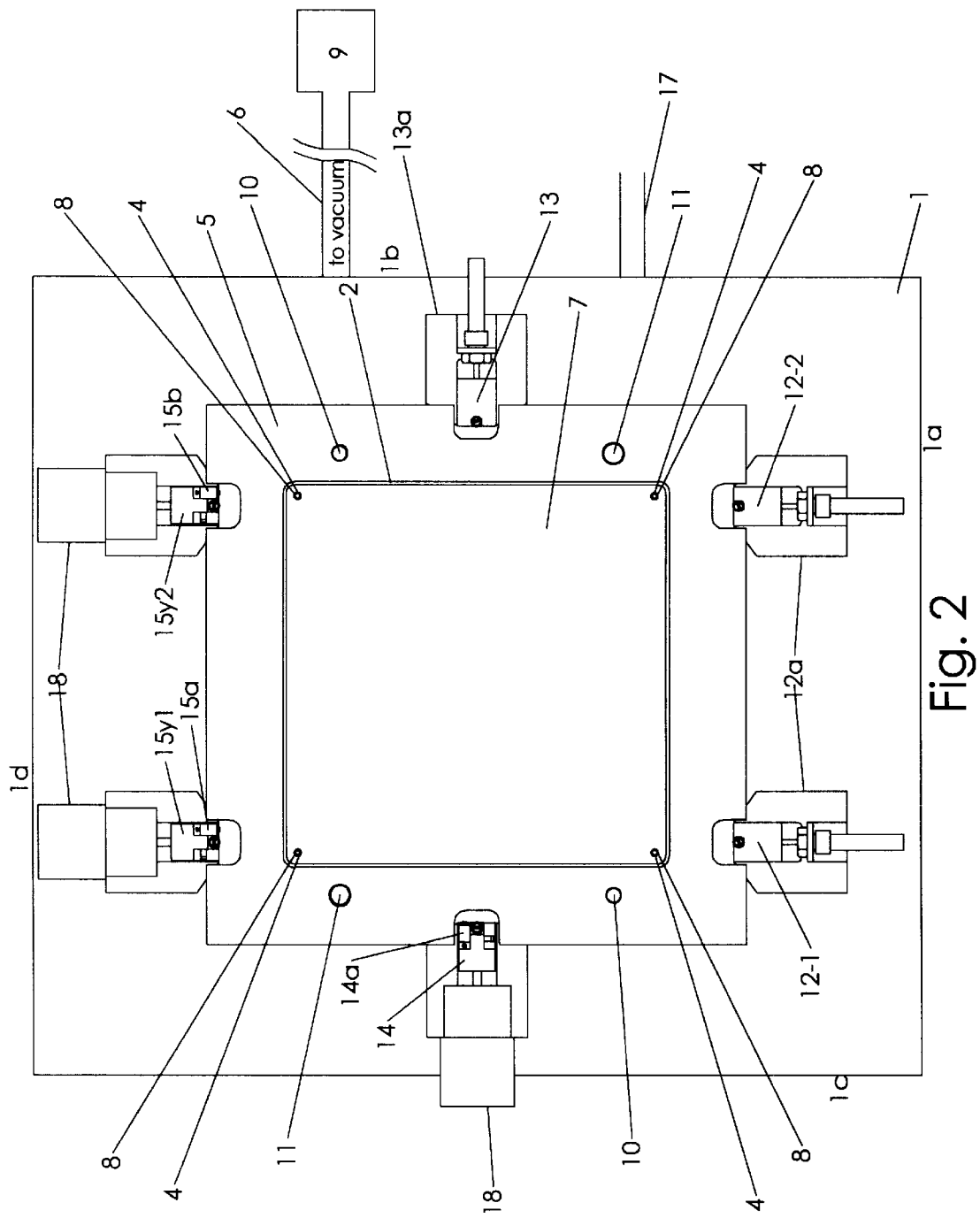
FIG. 2 shows an alignment tool for use in the inventive system with a product positioned thereon.

The mask alignment tool used in this system is shown in FIG. 1. The alignment tool is mounted on a stage top plate 1. The stage is designed to move the mask alignment tool in a horizontal plane; the details of the stage structure and function will be examined in detail below. The stage supports a product securing surface 2, and at least one mask frame supporting surface 5. The product-securing surface is a flat plate, at least a portion 3 of which is porous. Retractable registration pins 4 are arranged on at least two diagonally opposed corners of surface 2, and preferably at each corner of surface 2. A green sheet, semiconductor wafer, substrate coated with photoresist material, or other flat product 7 may be positioned on surface 2 by fitting each of pins 4 through a corresponding hole 8 in the product 7 so that the product lies flat on surface 2. A vacuum is then applied to the product through the porous portion 3 of surface 2 by evacuating a chamber 9 beneath the porous portion 3 of surface 2 (see FIG. 2) through tube 6. The vacuum holds the product in place so that pins 4 may be redacted beneath the surface of surface 2. The porous portion 3 of surface 2 may take the form of a plate having a plurality of holes therethrough, or a plate made from a porous ceramic material. The presently preferred embodiment is a rigid plate having a series of grooves therethrough; each groove is filled with the porous ceramic material Porex, allowing a vacuum to be applied through the plate without sacrificing plate rigidity.

Preferably, at least a portion of surface 2 is light-transmitting. A light source 16 (not shown in FIG. 1) is mounted under the porous plate, and shines through the porous surface. The light source may take the form of a ring light illuminator, with light being fed to the illuminator through fiber optic light source 17. This greatly facilitates the viewing of detection marks and/or alignment patterns on transparent products and/or masks.

The mask frame supporting surface is designed to support a mask 8a (FIG. 3) supported by a mask frame 8 above the product 7. Mask frame supporting surface(s) 5 may be separate structures from product securing surface 2, or 5 and 2 may be machined as part of the same structure. The only requirement is that surface 2 must be recessed from 0.01 to 0.1 inches below the surface of mask frame holding plate 5, so as to preclude direct contact between the mask and the product during the alignment process. The mask frame supporting surface comes equipped with a set of alignment pins, fixed alignment pins 10 and retractable fine alignment pins 11. When the mask frame is originally positioned on surface 5, fixed alignment pins 10 are fitted through corresponding holes 10a (FIG. 3) in the mask frame to position the mask frame in roughly the correct location. At this point, rectable fine alignment pins 11 are retracted below the surface of mask frame supporting surface 5. After the mask frame has been placed on surface 5, pins 11 are elevated so that they pass through fine alignment holes 11a in the mask frame 8. This positions the mask frame in (approximately) the correct position.

Figure 3:
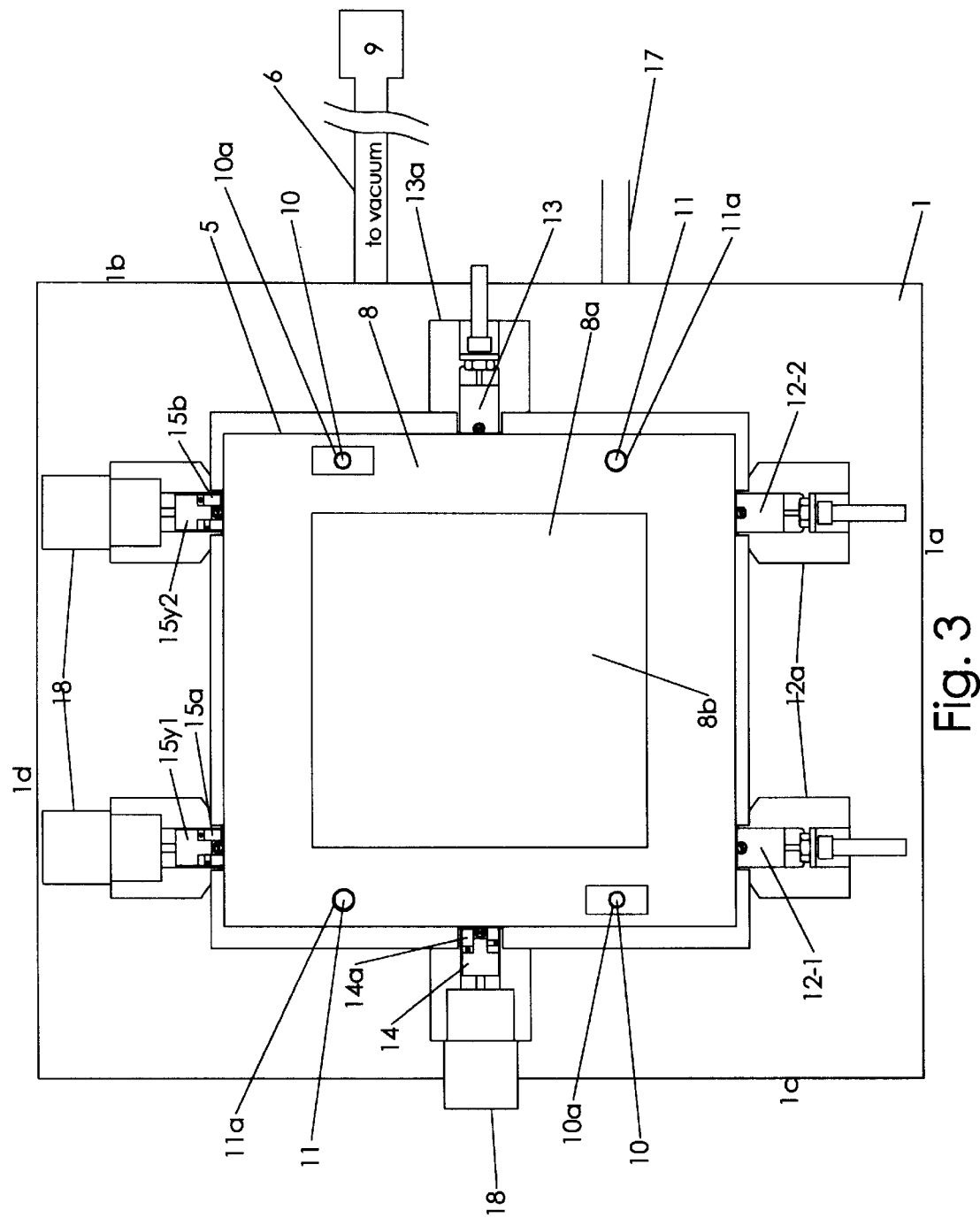
FIGS. 3 and 4 show an alignment tool for use in the inventive system with a mask positioned thereon (FIG. 4 shows both a mask and a product).
Figure 4:
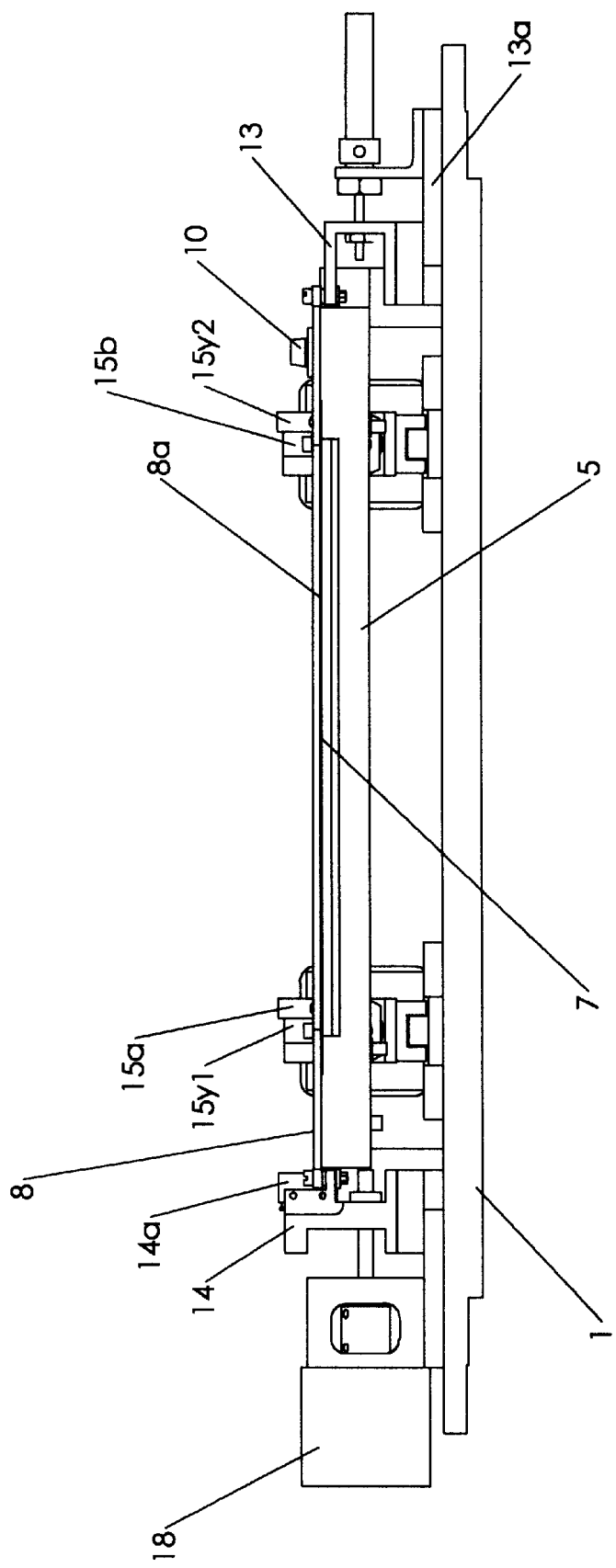

The mask positioning components of the mask alignment tool will now be described. As shown in FIG. 3, two movable plungers 12-1 and 12-2 are mounted on structures 12a fixed along one edge 1a of plate 1, and are each directed through gaps between mask supporting surfaces 5 toward product securing surface 2. Similarly, a movable plunger 13 is mounted on structure 13a fixed along a second edge 1b of plate 1, where edges 1a and 1b are at right angles to one another, and is directed through an additional gap between mask supporting surfaces 5 toward product securing surface 2. The movable plungers may be spring-actuated. Preferably, however, plungers 12-1, 12-2 and 13 are air cylinders actuated by an air supply which is preferably supplied by the user. As shown in FIG. 4, when the mask is positioned on mask supporting surfaces 5, plungers 12-1 and 12-2 are designed to press against one edge 8a of the mask frame 8, and plunger 13 presses against a second edge 8b of mask frame 8, where edges 8a and 8b are at right angles to one another. Plungers 12-1, 12-2 and 13 hold the mask frame against 14, push plates $15y_1$ and $15y_2$, capturing the mask and providing resistance to accidental movement of the mask toward plungers 12-1 and 12-2 or toward plunger 13.

Purposeful movement of the mask frame is achieved with a set of three motor-controlled push plates. A first push plate 14 is movably mounted on plate 1, directly across from the movable plunger 13. Similarly, two push plates $15y_1$ and $15y_2$ are movably mounted on plate 1, with each being positioned directly across from one of the two movable plungers 12-1 and 12-2. Stepper motors 18 are used to drive each push plate toward its corresponding plunger. For the sake of convenience, push plate 14 will be assumed to move in the x-direction, and push plates $15y_1$ and $15y_2$ will be assumed to move in the y-direction. A limit switch 14a is mounted on the front surface of push plate 14, while limit switches 15a and 15b are mounted on the front surfaces of push plates $15y_1$ and $15y_2$. The limit switches are actuated by contact with a surface, and may take the form of photoelectric switches, air differential pressure switches, or spring actuated switches. The limit switches are reversible, and are initially set so that if the switches are switched from their normal, open position to a closed position by contact with a surface, all power to the motors driving the push plates is terminated. The switches may then be reversed, so that power is provided to the motors when the limit switches are actually in contact with a surface.

The push plates may be mounted to plate 1 using low friction linear bearings, preferably high-precision crossed roller bearings or linear recirculating ball bearings. The push plates are driven using stepper motor 18. Each stepper motor may, for example, be used to rotate a threaded horizontal screw, and each push plate may have a nut rigidly secured thereto in such a way that rotation of the screw causes the nut to travel along the screw, canying the push plate along the screw in a linear fashion. Preferably, a ball screw and a recirculating ball nut are used. Each stepper motor may be an electronically-driven 0.45° stepper motor. This allows the push plates to be positioned vertically with a high degree of accuracy. Resolution of push plate position is approximately 0.5 micrometers/step. Alternatively, a rack rigidly mounted on the underside of each push plate may engage a rotatable pinion driven by a stepper motor. Rotation of the pinion by the step motor then causes the push plates to travel in a direction which is perpendicular to the axis of rotation of the push plates.

When the mask is initially positioned on the mask frame supporting surface 5 as in FIG. 3, each of the push plates 14, 15y$_1$ and 15y$_2$ (only 14 is shown in FIG. 4; also, the mechanism for driving the push plate is omitted from the drawing.) are initially removed from the mask frame edge. As shown in FIG. 4, each push plate is then moved toward the mask frame until its front edge contacts the edge of the mask frame, switching the limit switch and cutting off power to the motors driving the push plates. The limit switches are then reversed so that the push plates may be moved with their front edges in direct contact with the mask frame, allowing the operator to move the mask frame by using the push plates to push the mask frame against the movable plungers.

A computer records the precise position of the mask frame prior to alignment, based on the position of each push plate at the point where it initially contacts the mask frame. For example, the distance of the mask frame from edge 1c of plate 1 may be found by determining the distance between edge 1c and the front edge of push plate 14. The distance of the mask frame from edge 1d of plate 1 is determined similarly, except that a first distance between the mask frame and edge 1d may be determined based on the position of push plate 15y$_1$, and a second distance between the mask frame and edge 1d may be determined based on the position of a push plate 15y$_2$. The difference between the two distances between the mask frame and edge 1d may be used to determine the angle between edge 1d and the edge of the mask frame which contacts push plates 15y$_1$ and 15y$_2$.

B) Stage Assembly

As previously described, the mask alignment tool is positioned on stage top plate 1. The stage is able to move the sample in a horizontal plane so as to correctly position the sample in the field of view microscope positioned above the stage.

Figure 5:
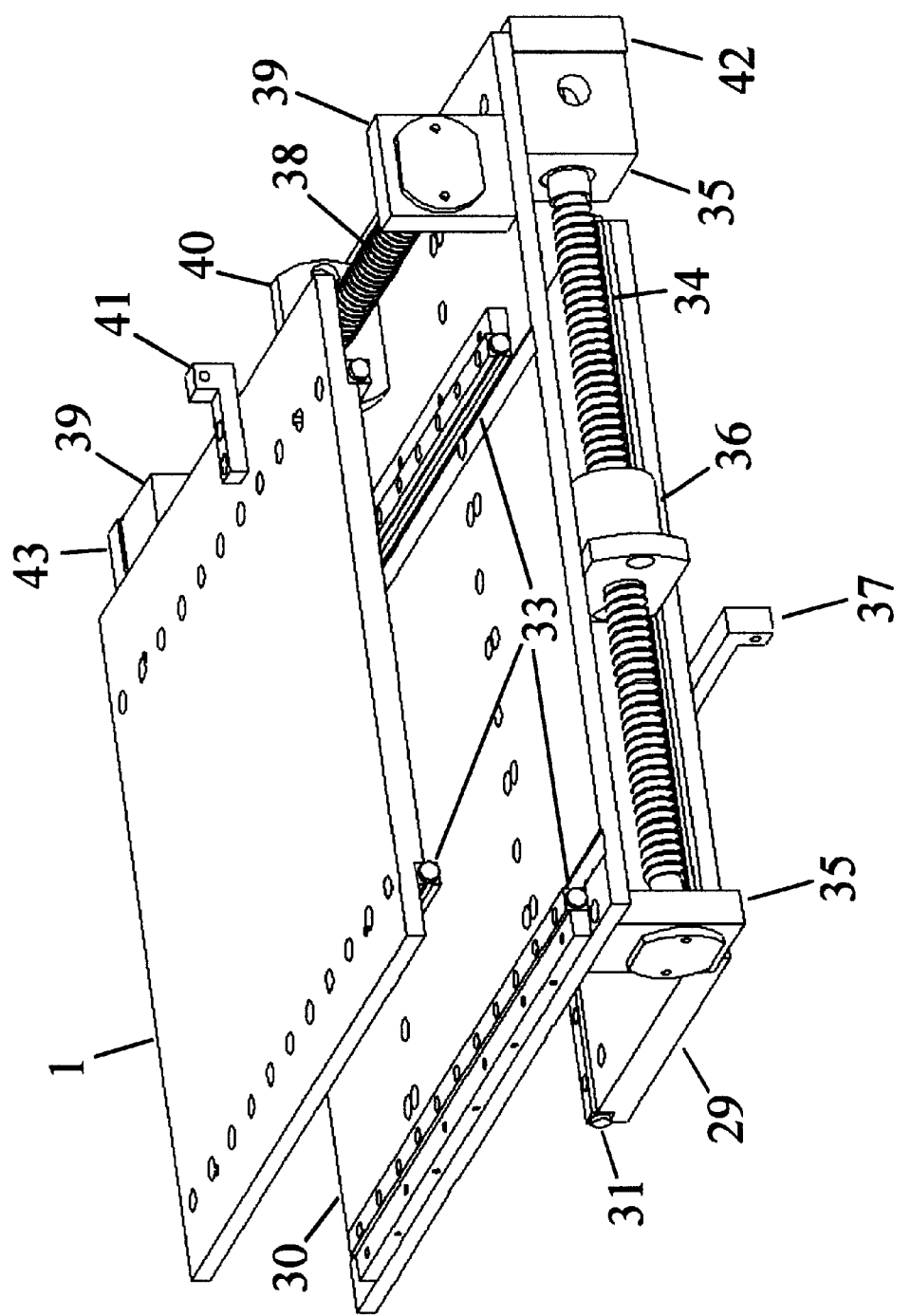
FIG. 5 shows an exploded view of a stage suitable for supporting the tool of FIG. 1.

The stage is constructed from three plates. An exploded view of the stage is seen in FIG. 5. A first horizontal support plate 29 is rigidly mounted above a planar support surface (i.e., a tabletop[not shown in the figure]). A second horizontal plate 30 is then mounted on the first support plate using linear bearings 31. These linear bearings are preferably high-precision crossed roller bearings or linear recirculating ball bearings. The linear bearings allow plate 30 to move horizontally in the y-direction, relative to plate 29. Stage top plate 1 is then mounted on plate 30 using linear bearings 33. These bearings allow plate 1 to move horizontally in the x-direction, which is orthogonal to the y direction. By moving plates 30 and 1 in mutually orthogonal directions, plate 1 may be moved freely to any position in a defined field of travel. For most purposes, a defined field of travel of from 10 cm×10 cm up to 90 cm×90 cm is adequate. The most preferred field of travel is 12 inches×12 inches (30.5 cm×30.5 cm).

The stage assembly also includes a means for driving plate 30 in the y-direction and a similar means for driving plate 1 in the x direction. The means for driving plate 30 comprises a horizontal threaded screw 34 rotatably mounted on the plate 29 by means of brackets 35. The axis of screw 34 is parallel to the y-direction. A nut 36 driven by the first screw 34 is rigidly attached to plate 30 by means of bracket 37. Rotation of screw 34 causes nut 36 to travel in the y-direction, carrying plate 30in the y-direction. Reversal of the direction of rotation of screw 34 causes nut 36 to reverse its direction of travel. Screw 34 is preferably a ball screw and nut 36 is preferably a recirculating ball nut; however, conventional screws and nuts may be used instead. Plate 1 is driven in a similar fashion. A second screw 38 is rotatably mounted on plate 30 by means of brackets 39, with its axis pointed in the x-direction. A second nut 40 driven by the screw 38 is rigidly attached to plate 1 by means of bracket 41.

Screws 34 and 38 are rotated by stepper motors 42 and 43. Preferably, the stepper motors are electronically driven and have a 0.9° step angle. Use of such a motor allows the stage to be positioned with excellent resolution. For example, let us suppose that plate 1 is driven by a ball screw 38 having 2 mm pitch. Such a ball screw will drive plate 1 a distance of 2 mm/revolution. Driving screw 38 with a stepper motor 43 having a 0.9.degree. step angle (400 steps/revolution) will result in a minimum movement of plate 1 of 5 micrometers. Employing quarter-step drive electronics increase the number of steps/revolution to 1600, reducing the minimum plate movement by a factor of 4. Microstepping drive electronics can increase the steps/revolution by orders of magnitude; however, this significantly increases the system cost.

Stepper motors 42 and 43 are operated under computer control. An operator may determine a desired feature on the mask and/or product that he wishes to examine, and instruct the computer to move the stage until this feature is within the microscope's field of view. This is done by causing the computer to send a signal activating stepper motor 43, rotating screw 38 and causing plate 1 to travel in the x-direction until the desired feature is either within the microscope's field of view, or may be brought into the microscope's field of view by moving plate 30 in the y-direction. If necessary, the operator then causes the computer to send a signal activating stepper motor 42, rotating screw 34 and causing plate 30 to travel in the y-direction until the desired feature is either within the microscope's field of view.

C) Optical Assembly

Figure 6:
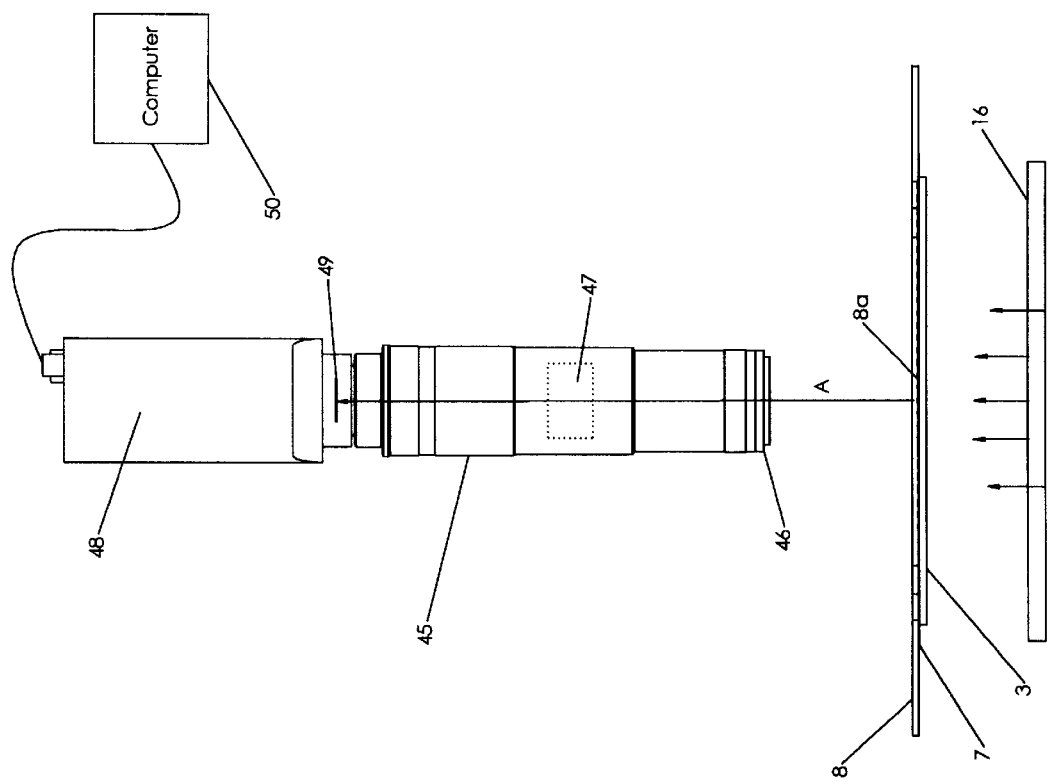
FIGS. 6 and 7 show two microscopes that may be used in conjunction with the tool of FIG. 1.

The surface of the mask 8a and/or the product 7 is preferably examined by a computer-controlled microscope. As shown in FIG. 6, the microscope may be used with a transmitted light illumination system. A light source 16 is positioned under the light-transmitting porous surface 3, as previously described. A light beam from the light source is transmitted through surface 3 and the product and/or mask positioned above the porous surface. The light beam then travels in the direction of arrow "A" to microscope 45. The light beam enters the microscope through objective lens 46, and an image of the mask and/or product carried by the light beam is then focused by a lens system 47 (shown as a single tube lens in FIG. 6) onto the imaging plane 49 of a video camera 48. The focused image is then transmitted from the camera 48 to a computer 50.

Figure 7:
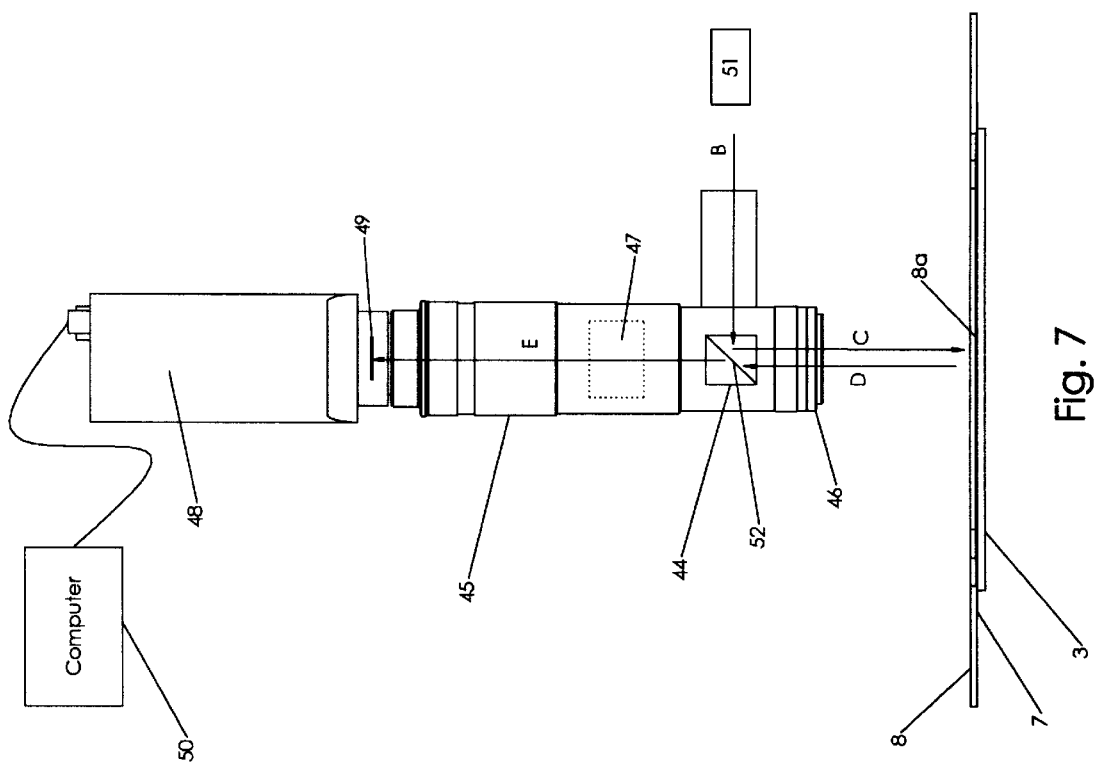

In the event that one or more of the mask and the product are opaque, the mask and product can be illuminated by reflected light, as shown in FIG. 7. Light is directed through the side of microscope 45 in the direction of arrow "B" by light source 51. The light beam then reflects off of beam splitter 52 in the direction of arrow "C" and passes through objective lens 46. The light beam then reflects off of the mask and/or the product, and the reflected light beam returns to microscope 45. The reflected light passes sequentially through lens 46 in the direction of arrow "D" and through beam splitter 52 in the direction of arrow "E". The reflected light is then focused onto the imaging plane 49 of camera 48 by lens system 47. The focused image is then transmitted from the camera 48 to a computer 50.

Figure 8:
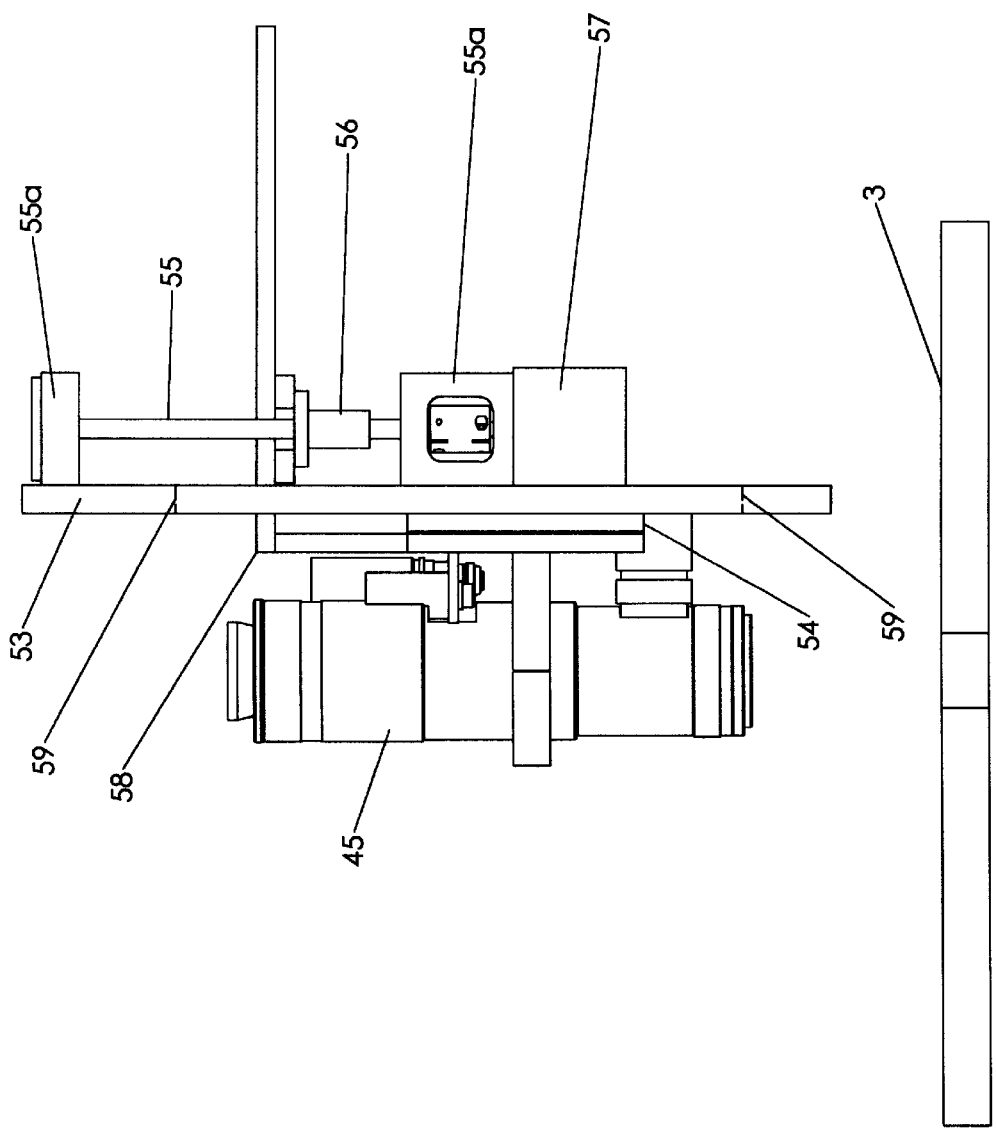
FIG. 8 shows a mechanism for adjusting the focus of the microscope.

Focus adjustment is achieved by moving the microscope up or down, relative to the porous plate 3, as shown in FIG. 8. The microscope is mounted to a horizontal plate 53 in such a way that the microscope may travel vertically relative to plate 53 on linear bearings 54. Preferably, high-precision crossed roller bearings or linear recirculating ball bearings are used as bearings 54. Recirculating ball bearings are most preferred due to their reduced cost.

Travel of the microscope is achieved by means of a threaded vertical screw 55, preferably a screw having 20 threads/inch, rotatably mounted on plate 53 by brackets 55a A nut 56 driven by the threaded vertical screw is rigidly attached to the microscope. A stepper motor 57 mounted to plate 53 is used to rotate the vertical screw. When the screw is rotated, the nut and microscope attached thereto travel vertically on the screw. Preferably, a ball screw and a recirculating ball nut are used. The stepper motor is preferably an electronically-driven 0.45° stepper motor. This allows the microscope to be positioned vertically with a high degree of accuracy. Resolution of microscope position is approximately 0.5 micrometers/step.

If a reduced degree of precision is acceptable in positioning the microscope, a conventional screw and a threaded nut may be used. Alternatively, a rack-and-pinion system may be used to move channel 58. This system would comprise a vertical rack mounted on plate 53 and a rotatable pinion engaging the rack, where the pinion is attached to the microscope. A stepper motor may be used to rotate the pinion. This mechanism is less precise than the screw-and-nut system, and is therefore less preferred for applications where high precision is required.

Focus adjustment is achieved by moving channel 58 vertically up or down in hole 59 using the screw rotatably mounted to plate 2, as previously described. This adjusts the focus of the observed image by varying the distance between the stage and the objective lens. Rotation of the screw is performed by stepper motor 57, which is under the control of a computer. If an observed image is out of focus, the operator directs the computer to move the objective lens vertically toward or away from the stage. The computer then sends a signal to the stepper motor causing the stepper motor to rotate the screw. Depending on the direction of rotation, the microscope is then moved vertically up or down. Once the image is in focus, the operator instructs the computer to stop the movement of channel 58. The vertical position of the microscope at this time may be stored in memory. The stored microscope position can be recalled at a later time, and the computer can automatically return the microscope to this position.

D) Operation of the Mask Alignment System

The operation of the mask alignment system will now be described. Initially, retractable registration pins 4 are elevated, and retractable alignment pins 11 are retracted. A product having a plurality of detection marks thereon is positioned on the porous surface 3 of the product supporting surface 2 so that a registration pin 4 fits through a hole in each corner of the product 7. A vacuum is then applied to the product through porous surface 3, securing the product 7 to surface 3. At this point, all of the registration pins 4 are retracted beneath the surface of porous surface 3.

The stage top plate 1 is then moved via computer-controlled stepper motors 42 and 43 so that a first detection mark on the product is positioned within the field of view of the microscope. The microscope focuses an image of the detection mark onto the imaging plane of video camera 48, which then transmits an image of the detection mark to the computer. The computer records the position of the first detection mark For example, if the product is transparent, the position of the first detection mark may be recorded relative to a reference grid imprinted on light-transmitting porous plate 3. If the product is opaque, or if no reference grid is provided, the position of the first detection mark may be recorded in terms of the distance in the x-direction and the distance in the y-direction between the first detection mark and a fixed reference point (i.e., a corner of porous plate 3 or top plate 1). Subsequently, each remaining detection mark is moved into the field of view of the microscope, and the position of each remaining detection mark is recorded in the same manner as described above. Normally, a product has a detection mark in each corner of the product.

A mask positioned within a mask frame is then obtained. The mask has a plurality of detection marks, one corresponding to each detection mark on the product. When the mask is properly aligned with the product, each detection mark on the mask exactly overlies one detection mark on the product. The detection marks on the mask may, for example, take the form of holes in the mask or transparent windows in the mask through which the detection marks in the product may be seen. The mask is positioned over the mask frame by fitting two rough alignment holes in the mask frame over fixed alignment pins 10. To improve initial mask alignment, the retractable alignment pins 1 are raised until they pass through two fine alignment holes in the mask frame.

The stage top plate 1 is then moved via computer-controlled stepper motors 42 and 43 so that a first detection mark on the mask is positioned within the field of view of the microscope. The microscope focuses an image of the detection mark onto the imaging plane of video camera 48, which then transmits an image of the detection mark to the computer. The computer records the position of the first detection mark on the mask. For example, if the detection marks on the product are visible through the mask, the position of the first detection mark may be recorded in terms of the distance in the x-direction and the distance in the y-direction between the first detection mark on the mask and the first detection mark on the product. If the detection marks on the product are not visible through the mask, the position of the first detection mark on the mask may be recorded in terms of the distance in the x-direction and the distance in the y-direction between the first detection mark and a fixed reference point Subsequently, each remaining detection mark on the mask is moved into the field of view of the microscope, and the position of each remaining mask detection mark is recorded in the same manner as described above.

The computer then compares the initial position of each detection mark on the mask to the initial position of the corresponding detection mark on the product, and determines how the mask must be moved relative to the product to achieve ideal alignment between each detection mark on the mask and its corresponding detection mark on the product. For example, in a case where each detection mark on the mask exactly overlays a detection mark on the product when the mask and the product are properly aligned, the computer may determine that the initial position of a first detection mark on the mask differs from the initial position of a first detection mark on the product by 0.01 inches in the x-direction, and by 0.02 inches in the y-direction. The first detection mark on the mask may be brought into registration with the first detection mark on the product by using the push plate 14 to push the mask frame in the x-direction by 0.01 inches, and then by using the push plates $15y_1$ and $15y_2$ to push the mask frame in the y direction by 0.02 inches. In this operation, push plates $15y_1$ and $15y_2$ move simultaneously with identical speed in the identical direction. Use of push plates 14, $15y_1$ and $15y_2$ to move the mask frame may be automatically initiated by the computer if the comparison of the initial position of the detection mark on the mask to the initial position of the corresponding detetion mark on the product indicates that the product is not properly aligned.

If one of the detection marks on the mask is correctly aligned with its corresponding detection mark on the product, but other detection marks on the mask are not correctly aligned with their corresponding product detection marks, it may be necessary to rotate the mask frame to achieve proper alignment. This may be achieved through application of an unbalanced force to the mask frame using push plates $15y_1$ and $15y_2$. For example, if one detection mark on the mask is correctly aligned, but another detection mark on the mask is too close to edge 1$d$ of stage top plate 1, the computer may send a signal causing the push plate $15y_1$ which is closer to the nonaligned detection mark on the mask to move toward its corresponding plunger, while causing the other push plate $15y_2$ to remain stationary. This leads to rotation of the mask frame. The mask frame may also be rotated by causing one of push plates $15y_1$ and $15y_2$ to move toward its corresponding plunger, while the other of push plates $15y_1$ and $15y_2$ moves away from its corresponding plunger.

E) Industrial Applicability

This computerized video mask alignment system is of obvious utility in materials science, photoresist technology, and semiconductor technology.

What is claimed is:

1. A system for aligning a mask and a product with high precision, comprising:
    a) a product securing surface, said product securing surface comprising a porous plate, a means for applying vacuum through said porous plate, and at least two registration pins that fit through registration holes in the product;
    b) a mask positioning surface for positioning a mask surrounded by a rectangular mask frame having at least two holes therethrough above the product, said mask positioning surface comprising a holding plate to support said mask frame and at least two alignment pins that fit through said holes in said mask frame;
    c) at least one movable first plunger that presses against a first edge of said mask frame;
    d) two movable second plungers that press against a second edge of said mask frame, said second edge being perpendicular to said first edge;
    e) at least one first computer-controlled movable push plate that moves said mask frame in a first direction by pushing said mask frame against at least one movable first plunger;
    f) two second movable computer-controlled movable push plates that either (a) move said mask frame in a second direction by pushing said mask frame against said two movable second plungers; or (b) rotate said mask frame by moving one of the said second movable push plates toward one of the said movable second plungers, while simultaneously moving the other of the said second movable push plates away from the other of the said movable second plungers; and
    g) a determining and signaling means for determining the relative position of the mask and product prior to alignment; determining that, to achieve ideal alignment, the mask must be moved in said first direction by a first distance, moved in said second direction by a second distance, and rotated by a defined amount; signaling said at least one first computer-controlled movable push plate to move said mask frame in said first direction by said first distance; signaling said two second computer-controlled movable push plates to move said mask frame in said second direction by said second distance; and signaling said two second computer-controlled movable push plates to rotate said mask frame by said defined amount.

2. The system of claim 1, wherein said product securing surface comprises a light-transmitting porous plate, an illumination system for transmitting light through said porous plate, a means for applying vacuum through said porous plate, and at least two registration pins that fit through corresponding registration holes in the product.

3. The system of claim 2, wherein the product has a plurality of first detection marks, and the mask has a plurality of second detection marks, wherein, when the mask and the product are ideally aligned, each of said first detection marks is aligned with one of said second detection marks.

4. The system of claim 3, wherein said porous plate is a recessed portion of said holding plate.

5. The system of claim 4, wherein the determining and signaling means (g) has further means to:
    a) record the position of each said first detection mark on a product mounted on said porous plate;
    b) record the position of each said second detection mark on a mask supported on said mask positioning surface;
    c) determine that, to align each said first detection mark with one said second detection mark, the mask must be moved in said first direction by (a) said first distance;
    d) determine that, to align each said first detection mark with one said second detection mark, the mask must be moved in said second direction by (a) said second distance;
    e) determine that, to align each said first detection mark with one said second detection mark, the mask must be rotated by said defined amount;
    f) signal said at least one said computer-controlled movable push plate to move said mask frame in said first direction by said first distance;

g) signal said two second computer-controlled movable push plates to move said mask frame in said second direction by said second distance; and h) signal said two second computer-controlled movable push plates to rotate said mask frame by said defined amount.

6. The system of claim 1, wherein said registration pins are retractable.

7. The system of claim 1, wherein said alignment pins comprise two fixed alignment pins, each fitting through a corresponding rough alignment hole in said mask frame, and two retractable alignment pins, each fitting through a corresponding fine alignment hole in said mask frame.

8. The system of claim 1, wherein said first and said second movable plungers are pressed against said mask frame by means of springs.

9. The system of claim 1, wherein said first and said second movable plungers are pressed against said mask frame by means of air cylinders.

10. The system of claim 1, further comprising a reversible first limit switch on said at least one first push plate in contact with said mask frame when said first push plate is positioned against said mask frame;

reversible second limit switches on said second push plates in contact with said mask frame when said second push plates are positioned against said mask frame; and a means to determine the position of said mask frame prior to alignment by:

setting said reversible first and second limit switches such that said first and second push plates are immobile after said reversible first and second limit switches are in contact with said mask frame;

moving said at least one push plate from a position away from said mask frame to a position where said first limit switch is in contact with said mask frame;

moving said second push plates from a position away from said mask frame to a position where said second limit switches are in contact with said mask frame;

determining said mask frame position from the position of said first and second push plates when said first and second limit switches are in contact with said mask frame; and setting said reversible first and second limit switches such that said first and second push plates will only move after said reversible first and second limit switches are in contact with said mask frame.

11. A system for aligning a mask and a product with high precision, wherein the mask has a plurality of first detection marks, the product has a plurality of second detection marks, and each first said detection mark is aligned with a said second detection mark when the mask and the product are properly aligned, said system comprising:

a) a product securing surface, said product securing surface comprising a porous plate, a means for applying vacuum through said porous plate, and at least two registration pins adapted to fit through corresponding registration holes in the product;

b) a mask position surface for positioning the mask surrounded by a rectangular mask frame having at least two holes therethrough, said mask positioning surface comprising a holding plate to support said mask frame and at least two alignment pins that fit through said holes in said mask frame; wherein said porous plate is a recessed portion of said holding plate;

c) at least one movable first plunger that presses against a first edge of said mask frame;

d) two movable second plungers that press against a second edge of said mask frame, said second edge being perpendicular to said first edge;

e) at least one first computer-controlled movable push plate to move said mask frame in a first direction by pushing said mask frame against said at least one movable first plunger;

f) two second movable computer-controlled push plates that either (a) move said mask frame in a second direction by pushing said mask frame against said two movable second plungers; or (b) rotate said mask frame by moving one of said second movable push plates toward one of said movable second plungers, while simultaneously moving the other of said second movable push plates away from the other of said movable second plungers;

g) a computer; and h) an imaging means which transmits an image to said computer; wherein said imaging means performs the functions of:

i) recording the position of each said second detection mark on the product; and ii) recording the position of each said first detection mark on the mask; and wherein said computer performs the functions of:

i) comparing said positions of said first detection marks to said positions of said second detection marks;

ii) determining that, to bring each said first detection mark into alignment with a said second detection mark, the mask must be moved in said first direction by a first distance, moved in said second direction by a second distance, and rotated by a defined amount;

iii) signaling at least one said first computer-controlled movable push plate to move said mask frame in said first direction by said first distance;

iv) signaling said two second computer-controlled movable controlled push plates to move said mask frame in said second direction by said second distance; and v) signaling said two second computer-controlled movable push plates to rotate said mask frame by said defined amount.

12. The system of claim 11, wherein said imaging means comprises a video camera, an optical microscope for focusing an image onto the imaging plane of said video camera, and a stage adapted to support said holding late so that said porous plate is within a field of view of said optical microscope; wherein said video camera transmits an image recorded on said imaging plane to said computer.

13. The system of claim 12, wherein said stage is moves said holding plate in a horizontal plane.

14. A system for aligning a mask and a product with high precision, comprising:

a) a means for supporting the product in a fixed position;

b) a means for supporting the mask surrounded by a rectangular mask frame above the product;

c) at least one movable first plunger that presses against a first edge of said mask frame;

d) two movable second plungers that press against a second edge of said mask frame, said second edge being perpendicular to said first edge;

e) at least one first computer-controlled movable push plate that pushes said mask frame in a first direction by pushing said mask frame against said at least one movable first plunger;

f) two second movable computer-controlled push plates that either (a) move said mask frame in a second direction by pushing said mask frame against said two movable second plungers; or (b) rotate said mask frame by moving one of said second movable push plates toward one of said movable second plungers, while simultaneously moving the other of the said second movable push plates away from the other of the said movable second plungers;

g) a means for determining the relative position of the mask and the product prior to alignment;

h) a means for determining that, to achieve proper alignment of the mask and the product, the mask must be moved in said first direction by a first distance, moved in said second direction by a second distance, and rotated by a defined amount;

i) a means for signaling said at least one computer-controlled movable push plate to push said mask frame in said first direction by said first distance;

j) a means for signaling said two second computer-controlled movable push plates to move said mask frame in said second direction by said second distance; and k) a means for signaling said two second computer-controlled movable push plates to rotate said mask frame by said defined amount.

15. A system for aligning a mask and a product with high precision, comprising:

a) a means for supporting the product in a fixed position;

b) a means for supporting the mask surrounded by a rectangular mask frame above the product, the mask being movable relative to the product;

c) at least one movable first plunger that presses against a first edge of said mask frame;

d) two movable second plungers that press against a second edge of said mask frame, said second edge being perpendicular to said first edge;

e) at least one first computer-controlled push plate that pushes said mask frame in a first direction by pushing said mask against said at least one movable first plunger;

f) two second movable computer-controlled push plates that either (a) move said mask frame in a second direction by applying a balanced force to said mask frame so as to push said mask frame against said two movable second plungers; or (b) rotate said mask frame by applying an unbalanced force to said mask frame;

g) a means for determining the relative position of the mask and the product prior to alignment;

h) a means for determining that, to achieve proper alignment of the mask and the product, the mask must be moved in said first direction by a first distance, moved in said second direction by a second distance, and rotated by a defined amount;

i) a means for signaling said at least one first computer-controlled movable push plate to push said mask frame in said first direction by said first distance;

j) a means for signaling said two second computer-controlled movable push plates to apply a balanced force to said mask frame so as to push said mask frame in said second direction by said second distance; and k) a means for signaling said two second computer-controlled movable push plates to rotate said mask frame by said defined amount by applying an unbalanced force to said mask frame.

* * * * *